(12) United States Patent
Tanaka

(10) Patent No.: US 11,296,193 B2
(45) Date of Patent: Apr. 5, 2022

(54) NITRIDE SEMICONDUCTOR DEVICE

(71) Applicant: ROHM CO., LTD., Kyoto (JP)

(72) Inventor: Taketoshi Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 85 days.

(21) Appl. No.: 16/249,366

(22) Filed: Jan. 16, 2019

(65) Prior Publication Data

US 2019/0237551 A1 Aug. 1, 2019

(30) Foreign Application Priority Data

Jan. 30, 2018 (JP) .............................. JP2018-014076

(51) Int. Cl.
*H01L 29/66* (2006.01)
*H01L 29/20* (2006.01)
*H01L 29/51* (2006.01)
*H01L 29/778* (2006.01)
*H01L 29/423* (2006.01)
*H01L 29/49* (2006.01)
*H01L 29/45* (2006.01)
*H01L 29/10* (2006.01)
(Continued)

(52) U.S. Cl.
CPC .... *H01L 29/2003* (2013.01); *H01L 29/42324* (2013.01); *H01L 29/42356* (2013.01); *H01L 29/4966* (2013.01); *H01L 29/518* (2013.01); *H01L 29/66462* (2013.01); *H01L 29/7786* (2013.01); *H01L 29/7787* (2013.01); *H01L 29/1066* (2013.01); *H01L 29/207* (2013.01); *H01L 29/402* (2013.01); *H01L 29/4238* (2013.01); *H01L 29/452* (2013.01)

(58) Field of Classification Search
CPC .......... H01L 29/2003; H01L 29/42356; H01L 29/4966; H01L 29/518; H01L 29/66462; H01L 29/7787; H01L 29/1066; H01L 29/207; H01L 29/402; H01L 29/42324; H01L 29/4238; H01L 29/452; H01L 29/7786
See application file for complete search history.

(56) References Cited

U.S. PATENT DOCUMENTS

2006/0273347 A1 12/2006 Hikita et al.
2010/0327293 A1 12/2010 Hikita et al.
(Continued)

FOREIGN PATENT DOCUMENTS

JP          2006339561 A    12/2006

*Primary Examiner* — Meiya Li
(74) *Attorney, Agent, or Firm* — Hamre, Schumann, Mueller & Larson, P.C.

(57) ABSTRACT

A nitride semiconductor device 1 includes a first nitride semiconductor layer 4, constituting an electron transit layer, a second nitride semiconductor layer 5, formed on the first nitride semiconductor layer 4 and constituting an electron supply layer, a nitride semiconductor gate layer 6, disposed on the second nitride semiconductor layer 5 and containing an acceptor type impurity, a metal film 7, formed on the nitride semiconductor gate layer 6, and a gate pad 23, connected to the metal film 7 via a gate insulating film 8 having a first surface and a second surface, the first surface of the gate insulating film 8 is electrically connected directly or via a metal to the metal film 7, and the second surface of the gate insulating film 8 is electrically connected directly or via a metal to the gate pad 23.

6 Claims, 10 Drawing Sheets

(51) Int. Cl.
*H01L 29/207* (2006.01)
*H01L 29/40* (2006.01)

(56) References Cited

U.S. PATENT DOCUMENTS

| | | | |
|---|---|---|---|
| 2011/0220978 A1* | 9/2011 | Ikeda | H01L 27/0605 257/296 |
| 2012/0049244 A1* | 3/2012 | Imada | H01L 23/49562 257/194 |
| 2012/0299011 A1 | 11/2012 | Hikita et al. | |
| 2013/0075788 A1* | 3/2013 | Tomabechi | H01L 29/7787 257/194 |
| 2013/0082336 A1* | 4/2013 | Imada | H01L 29/7787 257/409 |
| 2016/0043208 A1* | 2/2016 | Ikoshi | H01L 29/778 257/192 |

* cited by examiner

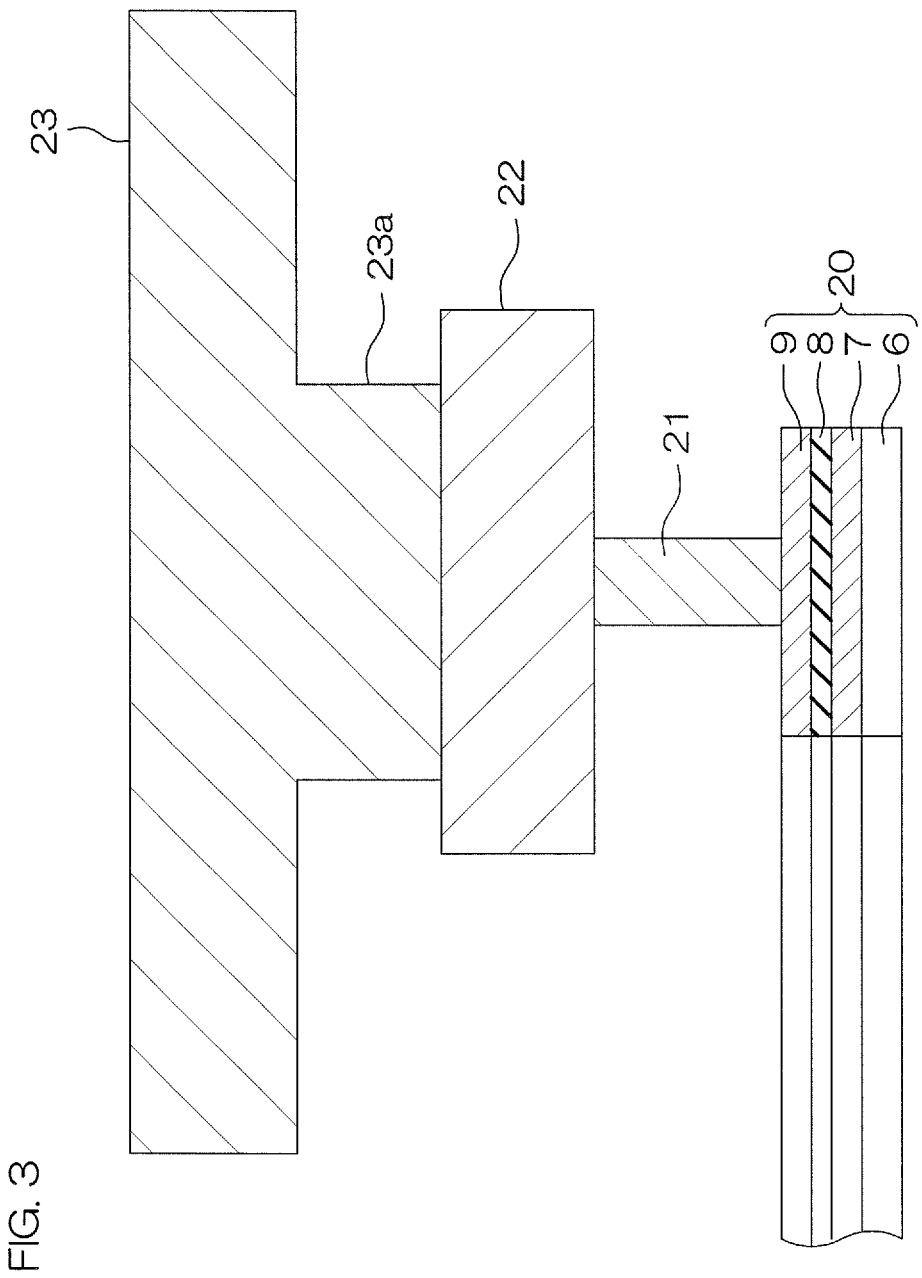

NITRIDE SEMICONDUCTOR DEVICE

CROSS REFERENCE TO RELATED APPLICATIONS

This application claims the benefit of priority to Japanese Patent Application No. 2018-014076 filed on Jan. 30, 2018. The entire contents of this application are hereby incorporated herein by reference.

BACKGROUND OF THE INVENTION

1. Field of the Invention

The present invention relates to a nitride semiconductor device constituted of a group III nitride semiconductor (may hereinafter be referred to simply as "nitride semiconductor" in some cases).

2. Description of the Related Art

A group III nitride semiconductor is a semiconductor with which nitrogen is used as a group V element in a group III-V semiconductor. Representative examples are aluminum nitride (AlN), gallium nitride (GaN), and indium nitride (InN). The semiconductor can be expressed generally as $Al_xIn_yGa_{1-x-y}N$ ($0 \leq x \leq 1$, $0 \leq y \leq 1$, $0 \leq x+y \leq 1$).

An HEMT (High Electron Mobility Transistor) using such a nitride semiconductor has been proposed. Such an HEMT includes, for example, an electron transit layer, constituted of GaN, and an electron supply layer, constituted of AlGaN that is grown epitaxially on the electron transit layer. A pair of source electrode and drain electrode are formed to be in contact with the electron supply layer and a gate electrode is disposed therebetween. Due to polarization caused by lattice mismatch of GaN and AlGaN, a two-dimensional electron gas is formed inside the electron transit layer at a position located only a few Å inward from an interface between the electron transit layer and the electron supply layer. The source and the drain are connected to each other with the two-dimensional electron gas as a channel. When the two-dimensional electron gas is cut off by application of a control voltage to the gate electrode, the source and the drain are cut off from each other. The source and the drain are continuous to each other in a state where the control voltage is not applied to the gate electrode and therefore the device is of the normally-on type.

Devices using a nitride semiconductor have features of high withstand voltage, high temperature operation, high current density, high speed switching, and low on resistance and are thus being examined for application to power devices.

However, for use as a power device, a device must be of the normally-off type, in which current is cut off in a zero bias state, and therefore an HEMT such as described above cannot be applied to a power device.

A structure for realizing a nitride semiconductor HEMT of the normally-off type has been proposed, for example, in Japanese Patent Application Publication No. 2006-339561.

SUMMARY OF THE INVENTION

Japanese Patent Application Publication No. 2006-339561 discloses an arrangement where a p type GaN gate layer (nitride semiconductor gate layer) is laminated on an AlGaN electron supply layer, a gate electrode is disposed thereon, and the channel is eliminated by a depletion layer spreading from the p type GaN gate layer to realize a normally-off arrangement. In Japanese Patent Application Publication No. 2006-339561, a gate electrode, constituted of Pd (palladium) in ohmic junction with the p type GaN gate layer, is used as the gate electrode.

Use of a gate electrode, constituted of TiN (titanium nitride) or other metal in Schottky junction with the p type GaN gate layer, as the gate electrode may be considered. A nitride semiconductor device, which is of such an arrangement and is a device where the gate electrode is electrically connected to a gate pad via a current path of a metal, may be referred to in some cases as a first comparative example. With the first comparative example, there is a problem in that due to the nitride semiconductor gate layer and the gate electrode being in Schottky junction, a gate leak current becomes large and the nitride semiconductor gate layer degrades readily.

The present inventor thus invented a nitride semiconductor device, with which the gate leak current can be reduced in comparison to the first comparative example by forming a gate insulating film on the nitride semiconductor gate layer and forming the gate electrode on the gate insulating film, and filed a patent application (Japanese Patent Application No. 2017-57830). A nitride semiconductor device of such an arrangement may be referred to in some cases as a second comparative example. With the second comparative example, fluctuation of threshold voltage may occur because an interface trap, into and from which electrons enter and exit, is formed at an interface between the nitride semiconductor gate layer and the gate insulating film.

An object of the present invention is to provide a nitride semiconductor device, with which the gate leak current can be reduced in comparison to the first comparative example and the fluctuation of the threshold voltage can be suppressed in comparison to the second comparative example.

In order to overcome the previously unrecognized and unsolved challenges described above, a preferred embodiment of the present invention includes a first nitride semiconductor layer, constituting an electron transit layer, a second nitride semiconductor layer, formed on the first nitride semiconductor layer and constituting an electron supply layer, a nitride semiconductor gate layer, disposed on the second nitride semiconductor layer and containing an acceptor type impurity, a metal film, formed on the nitride semiconductor gate layer, and a gate pad, connected to the metal film via a gate insulating film having a first surface and a second surface, the first surface of the gate insulating film is electrically connected directly or via a metal to the metal film, and the second surface of the gate insulating film is electrically connected directly or via a metal to the gate pad.

With the present arrangement, the gate insulating film is formed in a current path between the nitride semiconductor gate layer and the gate pad, and the gate leak current can thus be reduced in comparison to the first comparative example.

Although an interface trap is also formed in the present arrangement at an interface between the nitride semiconductor gate layer and the metal film, the interface trap is not a trap, into and from which electrons enter and exit, but acts to pin (fix) a barrier height. Therefore, with the present arrangement, it is possible to suppress the fluctuation of the threshold voltage in comparison to the second comparative example.

In the preferred embodiment of the present invention, the gate insulating film is constituted from a single film, constituted of SiN or $SiO_2$, or a laminated film, containing SiN or $SiO_2$.

In the preferred embodiment of the present invention, the gate leak current is not more than 1 nA/mm.

In the preferred embodiment of the present invention, the nitride semiconductor gate layer has a film thickness of not more than 100 nm and the gate insulating film has a film thickness of not less than 10 nm.

The preferred embodiment of the present invention, further includes a third nitride semiconductor layer, disposed at a side of the first nitride semiconductor layer opposite the second nitride semiconductor layer side and constituting a buffer layer.

In the preferred embodiment of the present invention, the first nitride semiconductor layer is constituted of a GaN layer, the second nitride semiconductor layer is constituted of an AlGaN layer, and the nitride semiconductor gate layer is constituted of a p type GaN layer.

In the preferred embodiment of the present invention, the first nitride semiconductor layer is constituted of a GaN layer, the second nitride semiconductor layer is constituted of an AlGaN layer, the nitride semiconductor gate layer is constituted of a p type GaN layer, and the third nitride semiconductor layer includes an AlGaN layer.

In the preferred embodiment of the present invention, an area of a surface of the gate insulating film is greater than an area of a surface of the nitride semiconductor gate layer.

A preferred embodiment of the present invention includes a first nitride semiconductor layer, constituting an electron transit layer, a second nitride semiconductor layer, formed on the first nitride semiconductor layer and constituting an electron supply layer, a nitride semiconductor gate layer, disposed on the second nitride semiconductor layer and containing an acceptor type impurity, a gate metal film, formed on the nitride semiconductor gate layer, a gate insulating film, formed on the gate metal film, and a gate electrode, formed on the gate insulating film.

With the present arrangement, the gate insulating film is interposed between the nitride semiconductor gate layer and the gate electrode as in the second comparative example, and the gate leak current can thus be reduced in comparison to the first comparative example.

Although an interface trap is also formed in the present arrangement at an interface between the nitride semiconductor gate layer and the gate metal film, the interface trap is not a trap, into and from which electrons enter and exit, but acts to pin (fix) the barrier height. Therefore, with the present arrangement, it is possible to suppress the fluctuation of the threshold voltage in comparison to the second comparative example.

In the preferred embodiment of the present invention, the gate insulating film is constituted from a single film, constituted of SiN or $SiO_2$, or a laminated film, containing SiN or $SiO_2$.

In the preferred embodiment of the present invention, the gate leak current is not more than 1 nA/mm.

In the preferred embodiment of the present invention, the nitride semiconductor gate layer has a film thickness of not more than 100 nm and the gate insulating film has a film thickness of not less than 10 nm.

The preferred embodiment of the present invention, further includes a third nitride semiconductor layer, disposed at a side of the first nitride semiconductor layer opposite the second nitride semiconductor layer side and constituting a buffer layer.

In the preferred embodiment of the present invention, the first nitride semiconductor layer is constituted of a GaN layer, the second nitride semiconductor layer is constituted of an AlGaN layer, and the nitride semiconductor gate layer is constituted of a p type GaN layer.

In the preferred embodiment of the present invention, the first nitride semiconductor layer is constituted of a GaN layer, the second nitride semiconductor layer is constituted of an AlGaN layer, the nitride semiconductor gate layer is constituted of a p type GaN layer, and the third nitride semiconductor layer includes an AlGaN layer.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is an illustrative sectional view taken along line III-III of FIG. 2.

DETAILED DESCRIPTION OF THE PREFERRED EMBODIMENTS

Figure 1:
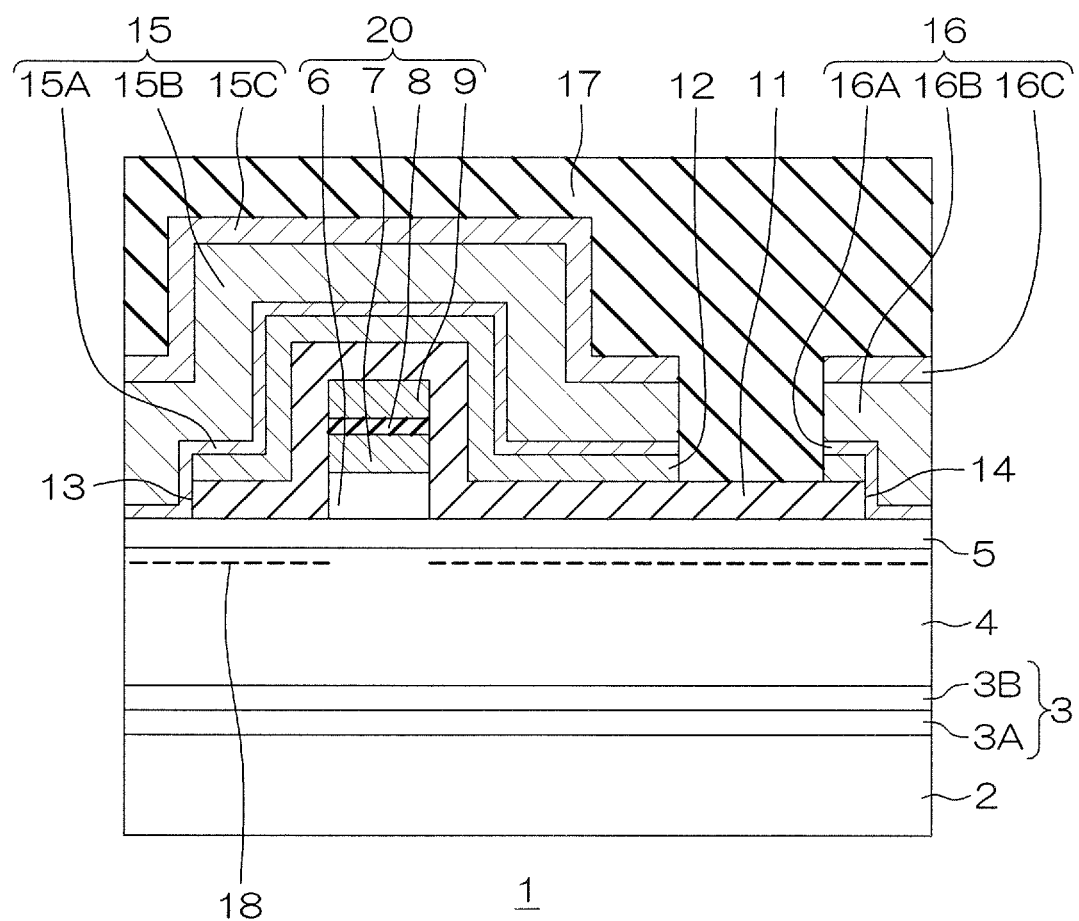
FIG. 1 is a sectional view for describing the arrangement of a nitride semiconductor device according to a first preferred embodiment of the present invention.

FIG. 1 is a sectional view for describing the arrangement of a nitride semiconductor device according to a first preferred embodiment of the present invention.

The nitride semiconductor device 1 includes a semiconductor laminated structure (nitride semiconductor structure) constituted of a substrate 2, a buffer layer 3, formed on a front surface of the substrate 2, a first nitride semiconductor layer 4, grown epitaxially on the buffer layer 3, and a second nitride semiconductor layer 5, grown epitaxially on the first nitride semiconductor layer 4. Further, the nitride semiconductor device 1 includes a gate portion 20 formed on the second nitride semiconductor layer 5.

Further, the nitride semiconductor device 1 includes a passivation film 11, covering the second nitride semiconductor layer 5 and the gate portion 20, and a barrier metal film 12, laminated on the passivation film 11. Further, the nitride semiconductor device 1 includes a source electrode 15 and a drain electrode 16, which penetrate through a source electrode contact hole 13 and a drain electrode contact hole 14, formed in the laminated film of the passivation film 11 and the barrier metal film 12, and are in ohmic contact with the second nitride semiconductor layer 5. The source electrode 15 and drain electrode 16 are disposed across an interval. The source electrode 15 is formed so as to cover the gate portion 20. Further, the nitride semiconductor device 1 includes an interlayer insulating film 17, covering the source electrode 15 and the drain electrode 16.

The substrate 2 may, for example, be a low-resistance silicon substrate. The low-resistance silicon substrate may have an impurity concentration, for example, of $1 \times 10^{17}$ cm$^{-3}$ to $1 \times 10^{20}$ cm$^{-3}$ (more specifically, approximately $1 \times 10^{18}$ cm$^{-}$). Also, besides a low-resistance silicon substrate, the substrate 2 may be a low-resistance GaN substrate or a low-resistance SiC substrate, etc. The substrate 2 has a thickness of approximately 650 μm.

In the present preferred embodiment, the buffer layer 3 is constituted from a multilayer buffer layer in which a plurality of nitride semiconductor films are laminated. In the present preferred embodiment, the buffer layer 3 is constituted from a first buffer layer 3A, constituted of an AlN film in contact with the front surface of the substrate 2, and a second buffer layer 3B, constituted of an AlGaN film laminated on a front surface of the first buffer layer 3A (the front surface at the side opposite the substrate 2 side). The first buffer layer 3A has a film thickness of approximately 100 nm to 300 nm. The second buffer layer 3B has a film thickness of approximately 100 nm to 5 μm. The buffer layer 3 may instead be constituted from a single film of AlN or a single film of AlGaN.

The first nitride semiconductor layer 4 constitutes an electron transit layer. In the present preferred embodiment, the first nitride semiconductor layer 4 is constituted of a GaN layer doped with an acceptor type impurity and has a thickness of approximately 100 nm to 5 μm. The concentration of the acceptor type impurity is preferably not less than $4 \times 10^{16}$ cm$^{-3}$. In the present preferred embodiment, the acceptor type impurity is C (carbon).

The second nitride semiconductor layer 5 constitutes an electron supply layer. The second nitride semiconductor layer 5 is constituted of a nitride semiconductor with a larger bandgap than the first nitride semiconductor layer 4. Specifically, the second nitride semiconductor layer 5 is constituted of a nitride semiconductor with a higher Al composition than the first nitride semiconductor layer 4. In a nitride semiconductor, the higher the Al composition, the larger the bandgap. In the present preferred embodiment, the second nitride semiconductor layer 5 is constituted of an $Al_{x1}Ga_{1-x1}N$ layer ($0<x1<1$) and has a thickness of approximately 10 nm to 30 nm.

The first nitride semiconductor layer 4 (electron transit layer) and the second nitride semiconductor layer 5 (electron supply layer) are thus constituted of nitride semiconductors that differ in bandgap (Al composition) and a lattice mismatch occurs therebetween. Due to spontaneous polarizations of the first nitride semiconductor layer 4 and the second nitride semiconductor layer 5 and a piezo polarization due to the lattice mismatch between the two, an energy level of a conduction band of the first nitride semiconductor layer 4 at an interface between the first nitride semiconductor layer 4 and the second nitride semiconductor layer 5 is made lower than a Fermi level. A two-dimensional electron gas (2 DEG) 18 is thereby made to spread at a position close to the interface between the first nitride semiconductor layer 4 and the second nitride semiconductor layer 5 (for example, at a distance of only several Å from the interface).

The gate portion 20 includes a nitride semiconductor gate layer 6, grown epitaxially on the second nitride semiconductor layer 5, a gate metal film 7, formed on the nitride semiconductor gate layer 6, a gate insulating film 8, formed on the gate metal film 7, and a gate electrode 9, formed on the gate insulating film 8. The gate portion 20 is disposed biasedly toward the source electrode contact hole 13.

The nitride semiconductor gate layer 6 is constituted of a nitride semiconductor doped with an acceptor type impurity. In the present preferred embodiment, the nitride semiconductor gate layer 6 is constituted of a GaN layer (p type GaN layer) doped with the acceptor type impurity and has a thickness of approximately 10 nm to 100 nm.

The film thickness of the nitride semiconductor gate layer 6 is preferably not more than 100 nm. The reason for this shall now be described. An electric field intensity in an interior of the nitride semiconductor gate layer 6 increases as a portion at the boundary with the gate metal film 7 is approached. Also, a nitride semiconductor is low in tolerable electric field intensity in comparison to an insulating film. Time dependent dielectric breakdown (TDDB) of the nitride semiconductor gate layer 6 thus occurs readily when the film thickness of the nitride semiconductor gate layer 6 becomes greater than 100 nm and this is the reason for the above. In the present preferred embodiment, the film thickness of the nitride semiconductor gate layer 6 is 60 nm.

The concentration of the acceptor type impurity implanted in the nitride semiconductor gate layer 6 is preferably not less than $3 \times 10^{17}$ cm$^{-3}$. In the present preferred embodiment, the acceptor type impurity is Mg (magnesium). The acceptor type impurity may instead be Fe or other acceptor type impurity besides Mg. The nitride semiconductor gate layer 6 is disposed in a region directly below the gate portion 20 to cancel out the two-dimensional electron gas 18 generated in the interface between the first nitride semiconductor layer 4 (electron transit layer) and the second nitride semiconductor layer 5 (electron supply layer).

The gate metal film 7 is formed to be in contact with a front surface of the nitride semiconductor gate layer 6. In the present preferred embodiment, the gate metal film 7 is constituted from a TiN layer and has a thickness of approximately 50 nm to 200 nm. In the present preferred embodiment, the film thickness of the gate metal film 7 is 100 nm. The gate metal film 7 may instead be constituted from a metal, such as Al, Pt, etc.

The gate insulating film 8 is formed to be in contact with a front surface of the gate metal film 7. In the present preferred embodiment, the gate insulating film 8 is constituted of SiN. The gate insulating film 8 has a thickness of approximately 10 nm to 30 nm. The film thickness of the gate insulating film 8 is preferably not less than 10 nm. In the present preferred embodiment, the film thickness of the gate insulating film 8 is 30 nm. Besides SiN, the gate insulating film 8 may be constituted from $SiO_2$, SiON, $Al_2O_3$, AlN, AlON, HfO, HfN, HfON, HfSiON, AlON, etc.

The gate electrode 9 is formed to be in contact with a front surface of the gate insulating film 8. In the present preferred embodiment, the gate electrode 9 is constituted from a TiN layer and has a thickness of approximately 50 nm to 200 nm. In the present preferred embodiment, the film thickness of the gate electrode 9 is 100 nm. As shall be described below, the gate electrode 9 is electrically connected to a gate pad 23 (see FIG. 2 and FIG. 3) that is not shown in FIG. 1.

The passivation film 11 covers a front surface of the second nitride semiconductor layer 5 (with the exception of regions facing the contact holes 13 and 14) and a side surface and a front surface of the gate portion 20. In the present preferred embodiment, the passivation film 11 is constituted of an SiN film and has a thickness of approximately 50 nm to 200 nm. In the present preferred embodiment, the thickness of the passivation film 11 is 50 nm.

The barrier metal film 12 is laminated on the passivation film 11. In the present preferred embodiment, the barrier metal film 12 is constituted of a TiN film and has a thickness of approximately 10 nm to 50 nm. In the present preferred embodiment, the thickness of the barrier metal film 12 is 25 nm.

In the present preferred embodiment, the source electrode 15 and the drain electrode 16 are constituted of lower layers (ohmic metal layers) 15A and 16A, in contact with the second nitride semiconductor layer 5, intermediate layers (main electrode metal layers) 15B and 16B, laminated on the lower layers 15A and 16A, and upper layers (barrier metal layers) 15C and 16C, laminated on the intermediate layers 15B and 16B. The lower layers 15A and 16A are, for example, Ti layers with thicknesses of approximately 10 nm to 20 nm. The intermediate layers 15B and 16B are Al layers with thicknesses of approximately 100 nm to 300 nm. The upper layers 15C and 16C are, for example, TiN with thicknesses of approximately 10 nm to 50 nm.

The interlayer insulating film 17 is constituted, for example, of SiO$_2$. The interlayer insulating film 17 has a thickness, for example, of approximately 1 μm.

With the nitride semiconductor device 1, a heterojunction is formed by the second nitride semiconductor layer 5 (electron supply layer), differing in bandgap (Al composition) from the first nitride semiconductor layer 4 (electron transit layer), being formed on the first nitride semiconductor layer 4. The two-dimensional electron gas 18 is thereby formed inside the first nitride semiconductor layer 4 near the interface between the first nitride semiconductor layer 4 and the second nitride semiconductor layer 5, and an HEMT making use of the two-dimensional electron gas 18 as a channel is formed. The gate electrode 9 faces the second nitride semiconductor layer 5 across the gate insulating film 8, gate metal film 7, and the nitride semiconductor gate layer 6.

Below the gate electrode 9, energy levels of the first nitride semiconductor layer 4 and the second nitride semiconductor layer 5 are pulled up by the ionized acceptors contained in the nitride semiconductor gate layer 6, constituted of the p type GaN layer. The energy level of the conduction band at the heterojunction interface between the first nitride semiconductor layer 4 and the second nitride semiconductor layer 5 is thus made higher than the Fermi level. Therefore, the two-dimensional electron gas 18, due to the spontaneous polarizations of the first nitride semiconductor layer 4 and the second nitride semiconductor layer 5 and the piezo polarization due to the lattice mismatch of the two layers, is not formed directly below the gate electrode 9 (gate portion 20). Therefore, when a bias is not applied to the gate electrode 9 (zero bias state), the channel due to the two-dimensional electron gas 18 is cut off directly below the gate electrode 9. A normally-off type HEMT is thus realized. When an appropriate on voltage (for example, of 3 V) is applied to the gate electrode 9, a channel is induced inside the first nitride semiconductor layer 4 directly below the gate electrode 9 and the two-dimensional electron gas 16 at both sides of the gate electrode 9 becomes connected. The source and the drain are thereby made continuous to each other.

For use, for example, a predetermined voltage (for example, of 200 V to 300 V), with which the drain electrode side becomes positive, is applied across the source electrode 15 and the drain electrode 16. In this state, an off voltage (0 V) or an on voltage (3 V) is applied to the gate electrode 9 with the source electrode 15 being at a reference potential (0 V).

Figure 2:
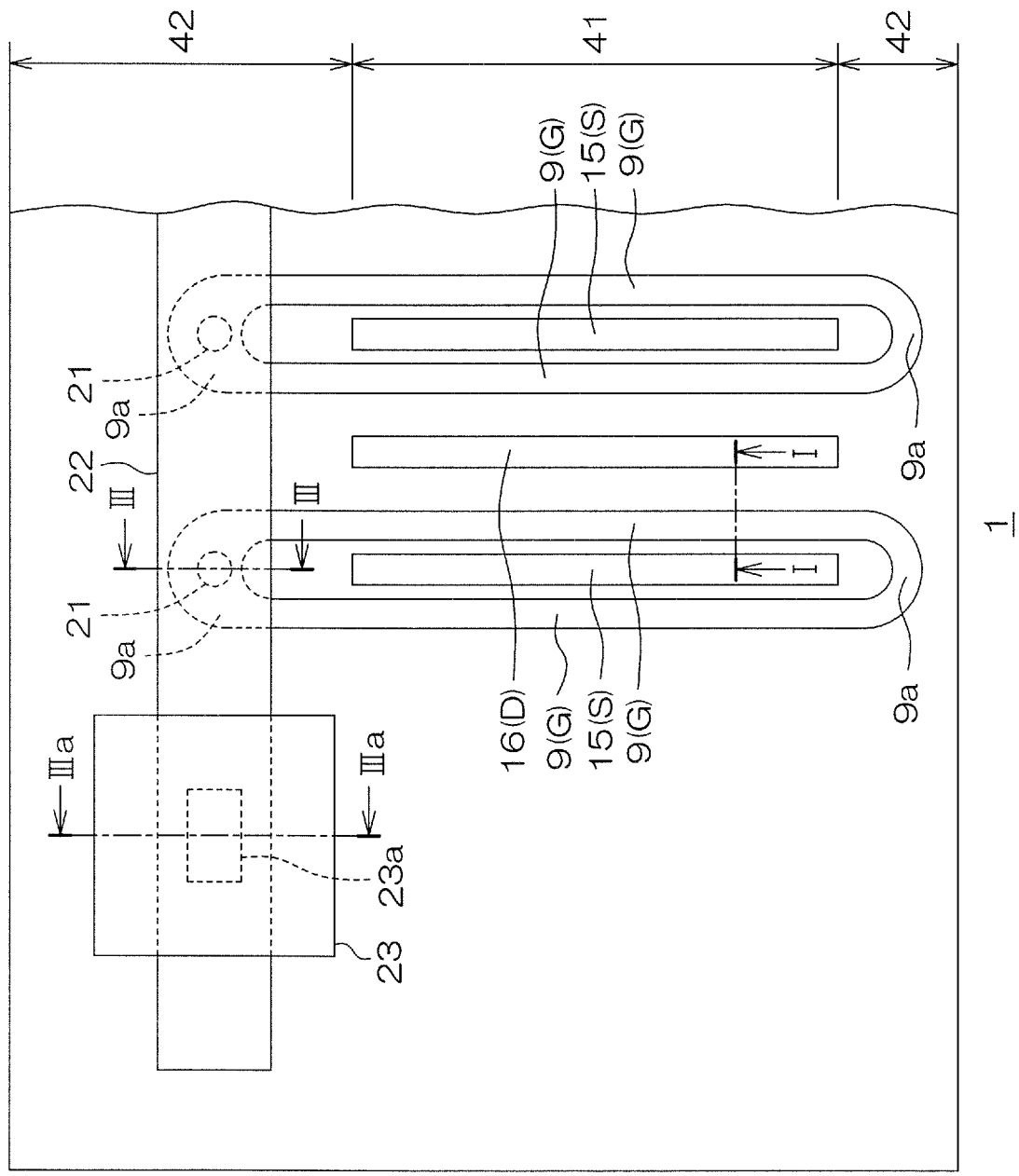
FIG. 2 is an illustrative plan view for mainly describing the arrangement of a current path between a gate pad and gate electrodes.

FIG. 2 is an illustrative plan view for mainly describing the arrangement of a current path between the gate pad and the gate electrodes. FIG. 3 is an illustrative sectional view taken along line of FIG. 2.

In FIG. 2 and FIG. 3, an insulating film that is present at a periphery of the current path between the gate pad 23 and the gate electrodes 9 is omitted for the convenience of description. FIG. 1, described above, shows a section taken along line I-I of FIG. 2.

In the example of FIG. 2, each source electrode 15 (S), each gate electrode 9 (G), and each drain electrode 16 (D) extend in a predetermined first direction (up-down direction of the paper surface of FIG. 2). In FIG. 2, portions of the source electrodes 15 (S) that cover the gate electrodes 9 (G) are omitted for the convenience of description. The source electrodes 15 (S), the gate electrodes 9 (G), and the drain electrodes 16 (D) are disposed periodically in the order of SGDGSGD in a second direction (right-left direction of the paper surface of FIG. 2) orthogonal to the first direction. Thereby, an element structure is arranged by each gate electrode 9 (G) being sandwiched by a source electrode 15 (S) and a drain electrode 16 (D). A region of a front surface of the semiconductor laminated structure includes an active area 41 that includes the element structure and non-active areas 42 besides the active area 41.

Respective end portions of two gate electrodes 9 (G), disposed at both sides of each source electrode 15 (S), extend toward the non-active areas 42 and the end portions are joined by joint portions 9a.

Referring to FIG. 2 and FIG. 3, in a non-active area 42 at one end portion sides of the gate electrodes 9, a gate wiring metal 22, extending in the second direction, is disposed at a position above the joint portions 9a at the one end portion sides of the gate electrodes 9. The gate wiring metal 22 is constituted, for example, of a TiN/AlCu/TiN laminated film in which a TiN film, an AlCu film, and a TiN film are laminated. The gate wiring metal 22 may instead be constituted from a metal single film or laminated film other than a TiN/AlCu/TiN laminated film. The gate wiring metal 22 has thickness of approximately 200 nm to 1000 nm.

The joint portions 9a at the one end portion sides of the gate electrodes 9 and the gate wiring metal 22 are electrically connected by gate vias 21 penetrating through the insulating film therebetween. The gate vias 21 are constituted, for example, of W (tungsten). The gate vias 21 may instead be constituted from a metal other than W (tungsten).

The gate pad 23 is disposed above one end portion of the gate wiring metal 22. In FIG. 3, a section taken along line IIIa-IIIa of FIG. 2 is shown for the gate pad 23. The gate pad 23 has, at a central portion of its lower surface, a connection portion 23a, projecting downward and having a lower surface bonded to a front surface of the gate wiring metal 22. The gate pad 23 is constituted, for example, of Al. The gate pad 23 may instead be constituted from a metal other than Al.

That is, the gate electrodes 9 are electrically connected to the gate pad 23 via the gate vias 21, constituted of a metal, and the gate wiring metal 22, constituted of a metal.

That is, with the present preferred embodiment, a metal film (gate metal film 7) is formed on each nitride semiconductor gate layer 6 and the gate pad 23 is connected to the metal film (gate metal film 7) via a gate insulating film 8, having a lower surface (first surface) and an upper surface (second surface). The lower surface (first surface) of the gate insulating film 8 is electrically connected directly to the metal film (gate metal film 7) and the upper surface (second surfaces) of the gate insulating film 8 is electrically connected to the gate pad 23 via metals (the gate electrode 9, a gate via 21, and the gate wiring metal 22).

A nitride semiconductor device of an arrangement, which, with respect to the nitride semiconductor device 1 of FIG. 1, is not provided with the gate metal film 7 and the gate insulating film 8 shall be referred to as a first comparative example. That is, with the first comparative example, the gate portion 20 is constituted of the nitride semiconductor gate layer 6, formed on the second nitride semiconductor layer 5, and the gate electrode 9, formed to be in contact with the front surface of the nitride semiconductor gate layer 6.

Also, a nitride semiconductor device of an arrangement, which, with respect to the nitride semiconductor device 1 of FIG. 1, is not provided with the gate metal film 7 shall be referred to as a second comparative example. That is, with the second comparative example, the gate portion 20 is constituted of the nitride semiconductor gate layer 6, formed on the second nitride semiconductor layer 5, the gate insulating film 8, formed to be in contact with the front surface of the nitride semiconductor gate layer 6, and the gate electrode 9, formed to be in contact with the front surface of the gate insulating film 8.

With the first comparative example, there is a problem in that due to the nitride semiconductor gate layer 6 and the gate electrode 9 being in Schottky junction, a gate leak current becomes large and the nitride semiconductor gate layer 6 degrades readily. With the second comparative example, the gate leak current can be reduced in comparison to the first comparative example because the gate insulating film 8 is interposed between the nitride semiconductor gate layer 6 and the gate electrode 9. However, with the second comparative example, fluctuation of threshold voltage may occur because an interface trap, into and from which electrons enter and exit, is formed at an interface between the nitride semiconductor gate layer 6 and the gate insulating film 8 (semiconductor/insulating film interface).

With the nitride semiconductor device 1 according to the first preferred embodiment described above, the gate leak current can be reduced in comparison to the first comparative example because, as with the second comparative example, the gate insulating film 8 is interposed between the nitride semiconductor gate layer 6 and the gate electrode 9. In other words, the gate leak current can be reduced in comparison to the first comparative example because the gate insulating film 8 is formed in a current path between the nitride semiconductor gate layer 6 and the gate pad 23. The nitride semiconductor gate layer 6 is thereby made less likely to degrade. With the present preferred embodiment, the gate leak current is not more than 1 nA/mm.

Although an interface trap is also formed in the nitride semiconductor device 1 according to the first preferred embodiment at an interface between the nitride semiconductor gate layer 6 and the gate metal film 7 (semiconductor/metal film interface), the interface trap is not a trap, into and from which electrons enter and exit, but acts to pin (fix) a barrier height. Therefore, with the nitride semiconductor device 1 according to the first preferred embodiment, it is possible to suppress the fluctuation of the threshold voltage in comparison to the second comparative example.

FIG. 4A to FIG. 4G are sectional views for describing an example of a manufacturing process of the nitride semiconductor device 1 described above and show a cross-sectional structure at a plurality of stages in the manufacturing process.

Figure 4A:
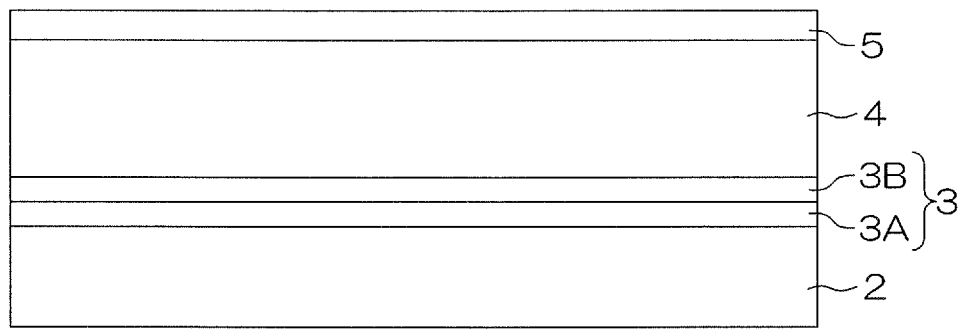
FIG. 4A is a sectional view of an example of a manufacturing process of the nitride semiconductor device.

First, as shown in FIG. 4A, the buffer layer 3 and the first nitride semiconductor layer (electron transit layer) 4 are successively grown epitaxially on the substrate 2 by an MOCVD (Metal Organic Chemical Vapor Deposition) method. Further, the second nitride semiconductor layer (electron supply layer) 5 is grown epitaxially on the first nitride semiconductor layer 4 by the MOCVD method.

Figure 4B:
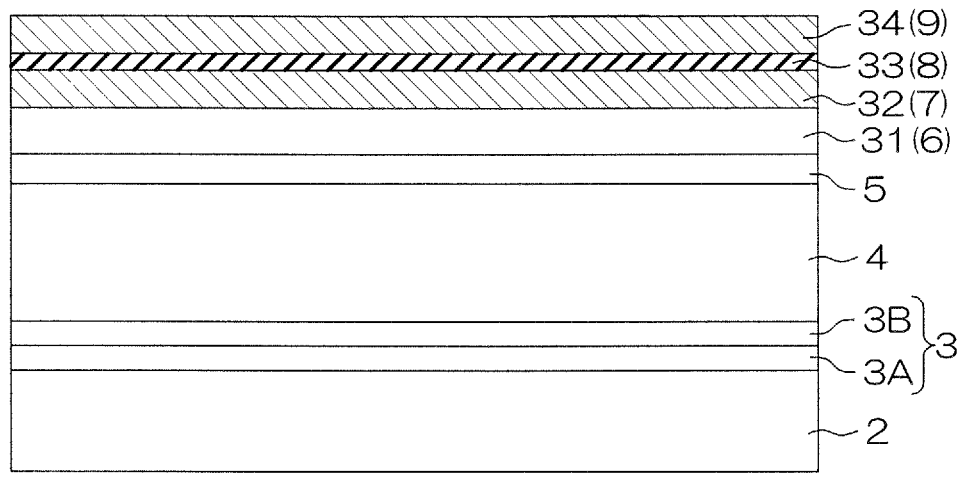
FIG. 4B is a sectional view of a process subsequent that of FIG. 4A.

Next, as shown in FIG. 4B, a gate layer material film 31, which is a material film of the nitride semiconductor gate layer 6, is formed on the second nitride semiconductor layer 5 by the MOCVD method. Next, a gate metal material film 32, which is a material film of the gate metal film 7, is formed on the gate layer material film 31 by a sputtering method or a vapor deposition method. The gate metal material film 32 is constituted, for example, of a metal film of TiN.

Next, an insulating material film 33, which is a material film of the gate insulating film 8, is formed on the gate metal material film 32. If, as in the preferred embodiment described above, the gate insulating film 8 is constituted of SiN, film formation of the gate insulating film 33 may be performed by the MOCVD method or a plasma CVD method. If the gate insulating film 8 is constituted from $SiO_2$ or other material besides SiN, the insulating material film 33 may be formed as a film on the gate layer material film 32 by the plasma CVD method, an LPCVD (Low Pressure CVD) method, an ALD (Atomic Layer Deposition) method, etc.

Thereafter, a gate electrode film 34, which is a material film of the gate electrode 9, is formed on the insulating material film 33 by the sputtering method or the vapor deposition method. The gate electrode film 34 is constituted, for example, of a metal film of TiN.

Figure 4C:
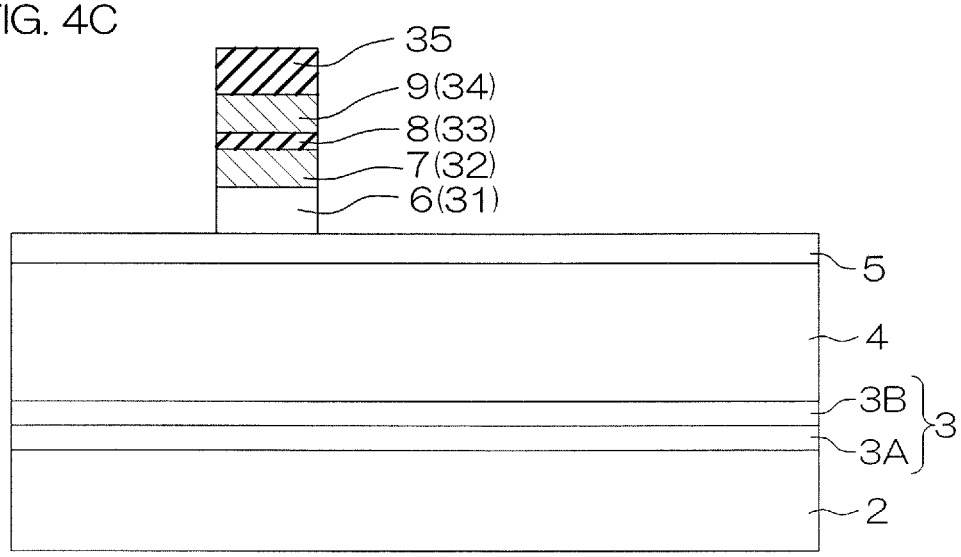
FIG. 4C is a sectional view of a process subsequent that of FIG. 4B.

Next, as shown in FIG. 4C, a resist film 35, covering a region of a front surface of the gate electrode film 34 at which the gate electrode is to be prepared, is formed. The gate electrode film 34, the insulating material film 33, the gate metal material film 32, and the gate layer material film 31 are then etched selectively using the resist film 35 as a mask.

The gate electrode film 34 is thereby patterned and the gate electrode 9 is obtained. Also, the insulating material film 33, the gate metal material film 32, and the gate layer material film 31 are patterned in the same pattern as the gate electrode 9. The gate portion 20, constituted of the nitride semiconductor gate layer 6, the gate metal film 7, the gate insulating film 8, and the gate electrode 9, is thereby formed on the second nitride semiconductor layer 5.

Figure 4D:
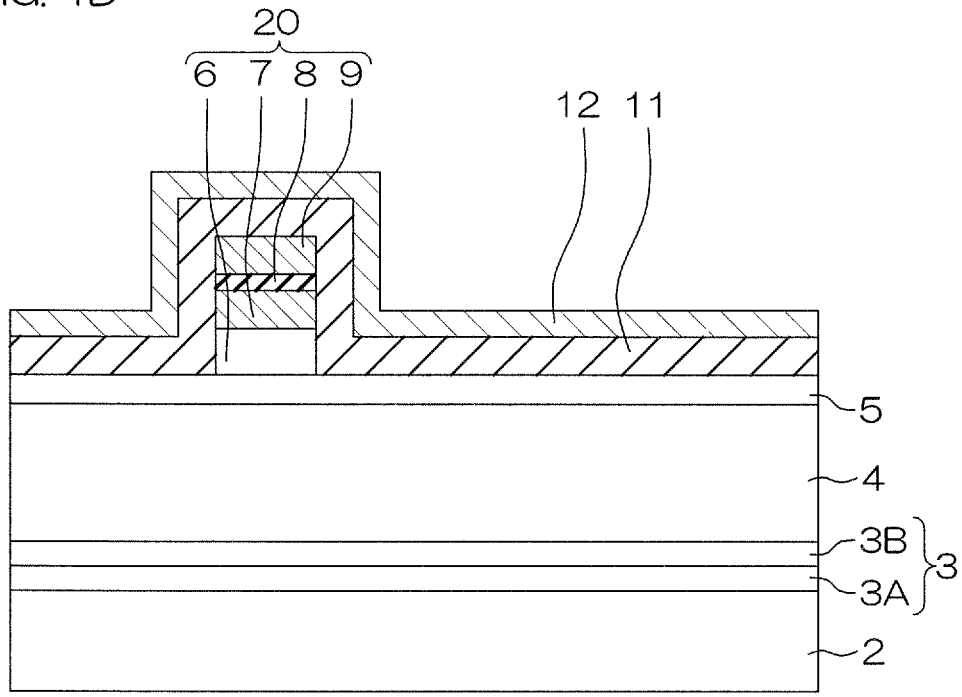
FIG. 4D is a sectional view of a process subsequent that of FIG. 4C.

Next, the resist film 35 is removed. Thereafter, as shown in FIG. 4D, the passivation film 11 is formed by the plasma CVD method or the LPCVD method so as to cover entireties of exposed front surfaces. The barrier metal film 12 is then formed on a front surface of the passivation film 11 by the sputtering method. The passivation film 11 is constituted, for example, of an SiN layer. The barrier metal film 12 is constituted, for example, of a TiN layer.

Figure 4E:
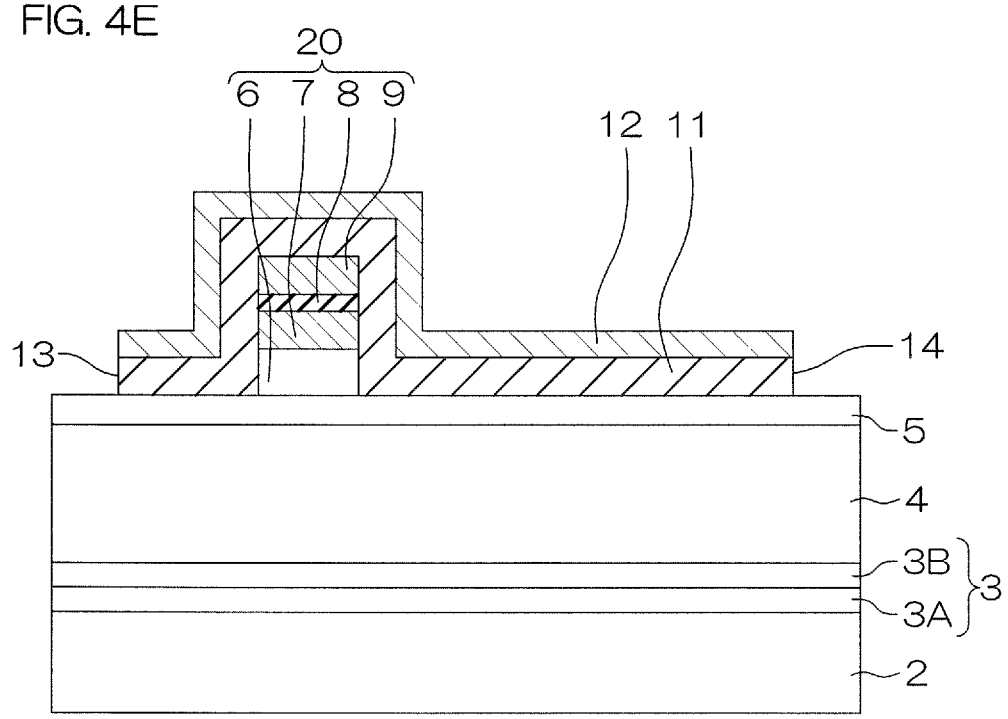
FIG. 4E is a sectional view of a process subsequent that of FIG. 4D.

Next, as shown in FIG. 4E, the source electrode contact hole 13 and the drain electrode contact hole 14 are formed in the laminated film of the passivation film 11 and the barrier metal film 12.

Figure 4F:
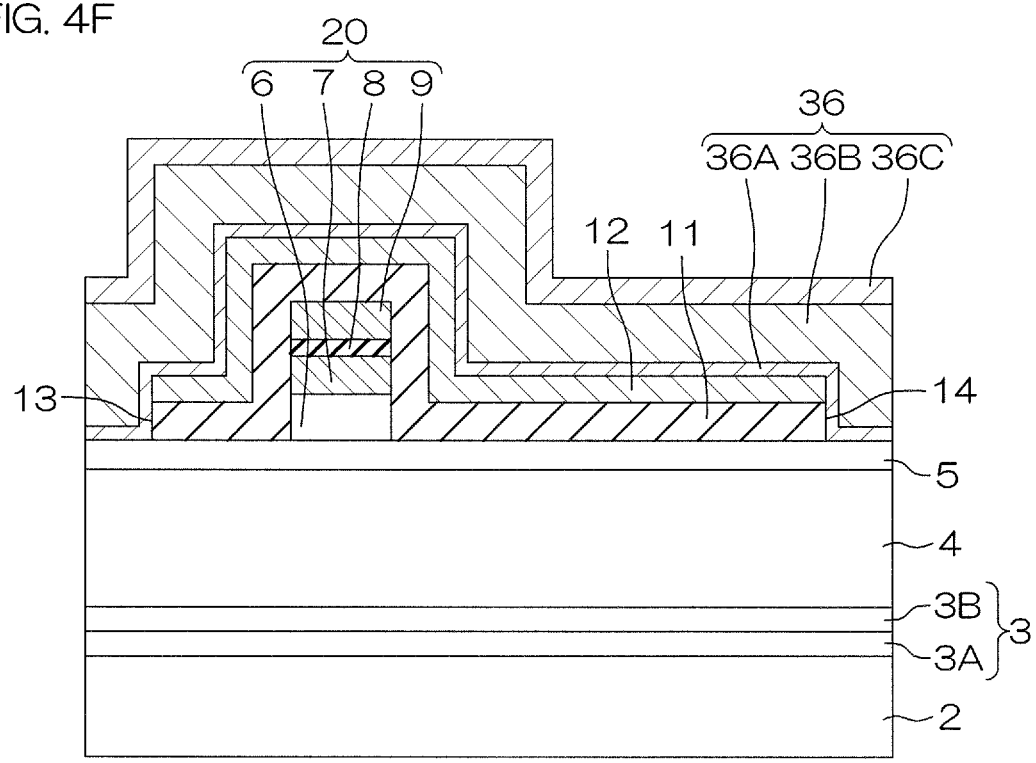
FIG. 4F is a sectional view of a process subsequent that of FIG. 4E.

Next, as shown in FIG. 4F, a source/drain electrode film 36 is formed so as to cover entireties of exposed front surfaces. The source/drain electrode film 36 is constituted of a laminated metal film, in which are laminated a Ti layer 36A as a lower layer, an Al layer 36B as an intermediate layer, and a TiN layer 36C as an upper layer, and is formed by vapor depositing the respective layers successively.

Figure 4G:
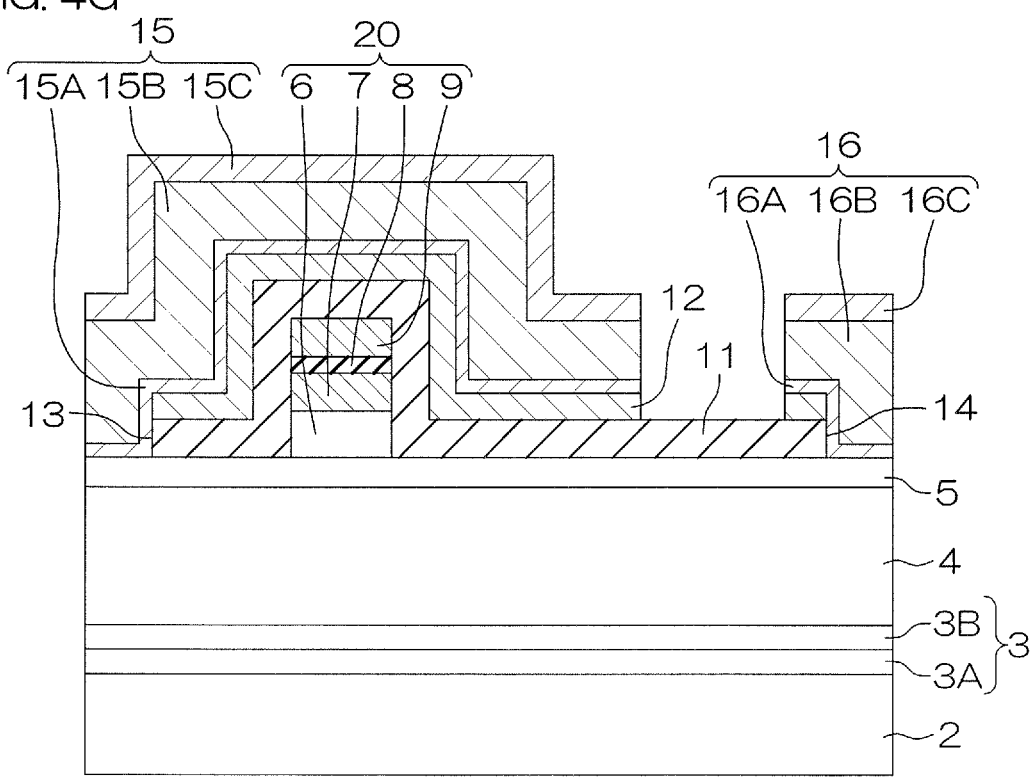
FIG. 4G is a sectional view of a process subsequent that of FIG. 4F.

Next, as shown in FIG. 4G, the source/drain electrode film 36 and the barrier metal film 12 are patterned by etching and further subject to an annealing processing to form the source electrode 15 and the drain electrode 16 in ohmic contact with the second nitride semiconductor layer 5. The source electrode 15 is constituted from a lower layer 15A, constituted of the TiN layer 36A, an intermediate layer 15B, constituted of the Al layer 36B, and an upper layer 15C, constituted of the TiN layer 36C. Also, the drain electrode 16 is constituted from a lower layer 16A, constituted of the TiN layer 36A, an intermediate layer 16B, constituted of the Al layer 36B, and an upper layer 16C, constituted of the TiN layer 36C.

Thereafter, the interlayer insulating film 17 is formed so as to cover the source electrode 15 and the drain electrode 16, and the nitride semiconductor device 1 with the structure such as shown in FIG. 27 is thereby obtained.

Figure 5:
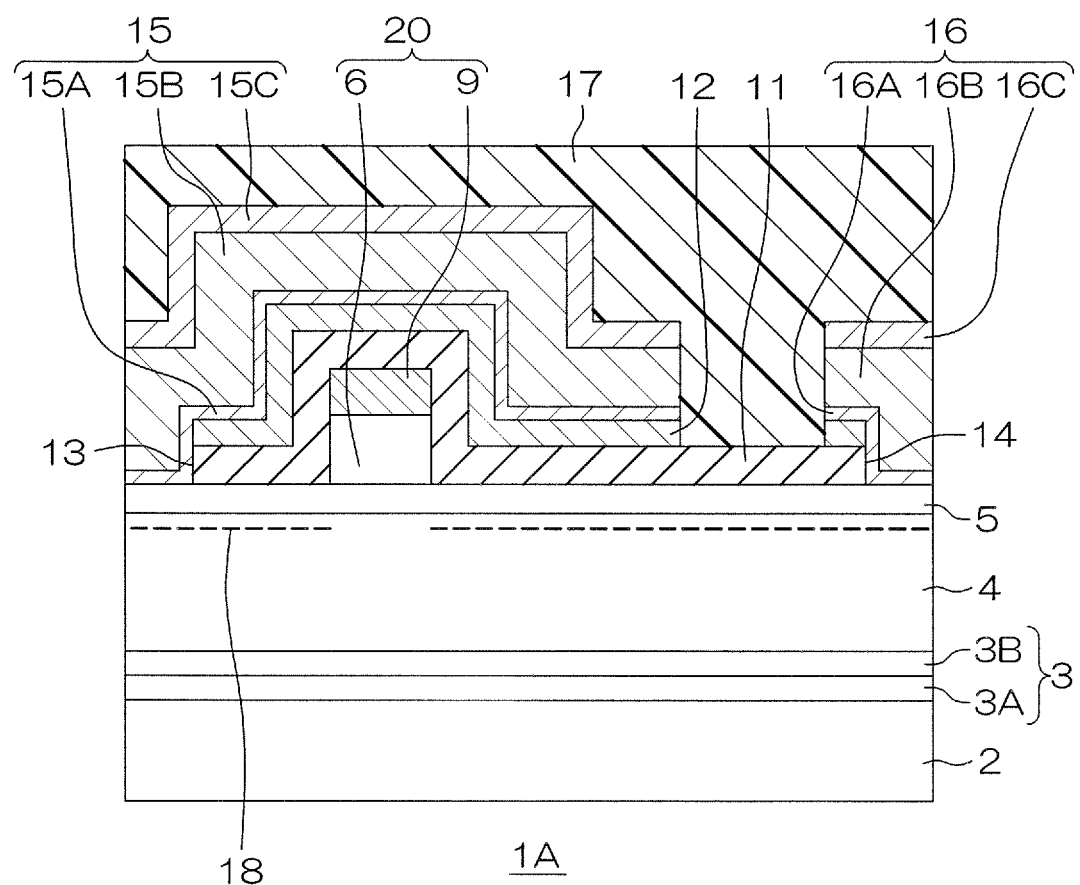
FIG. 5 is a sectional view for describing the arrangement of a nitride semiconductor device according to a second preferred embodiment of the present invention.
Figure 6:
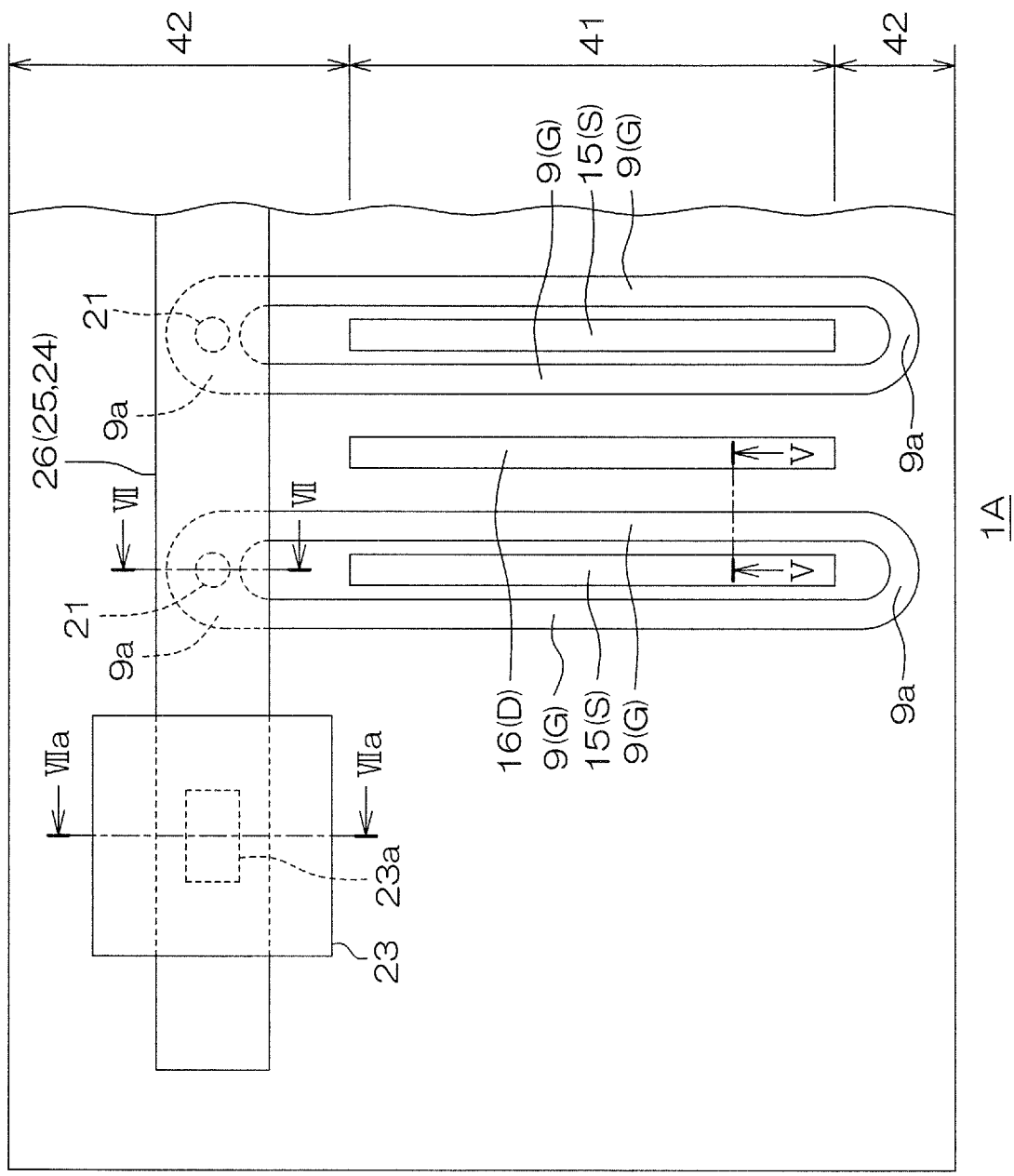
FIG. 6 is an illustrative plan view for mainly describing the arrangement of a current path between a gate pad and gate electrodes.
Figure 7:
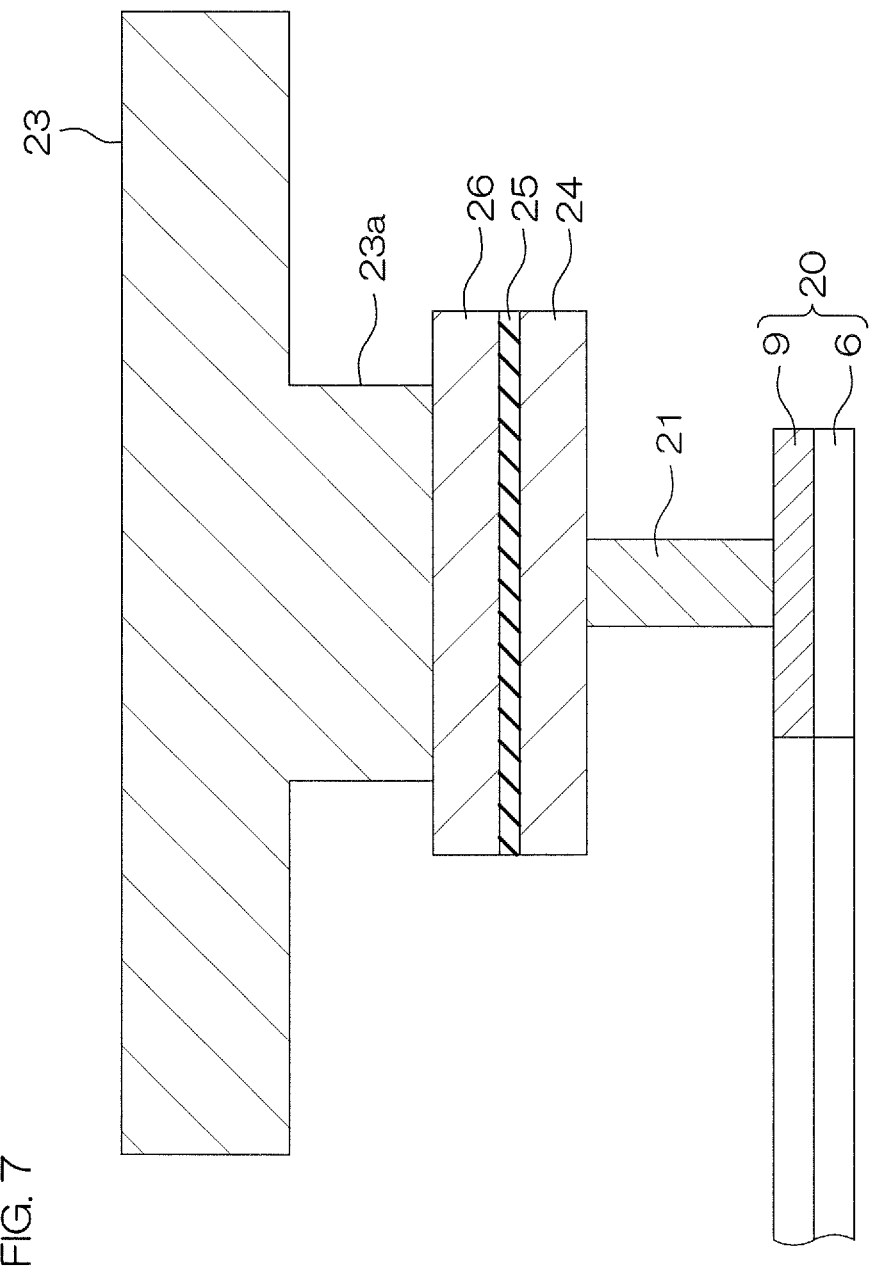
FIG. 7 is an illustrative sectional view taken along line VII-VII of FIG. 6.

FIG. 5 is a sectional view for describing the arrangement of a nitride semiconductor device according to a second preferred embodiment of the present invention. FIG. 6 is an illustrative plan view for mainly describing the arrangement of a current path between a gate pad and gate electrodes. FIG. 7 is an illustrative sectional view taken along line VII-VII of FIG. 6. In FIG. 5, FIG. 6, and FIG. 7, portions corresponding to respective portions in FIG. 1, FIG. 2, and FIG. 3 described above are indicated with the same symbols attached as in FIG. 1, FIG. 2, and FIG. 3.

In FIG. 6 and FIG. 7, an insulating film that is present at a periphery of the current path between the gate pad 23 and the gate electrodes 9 is omitted for the convenience of description. FIG. 5 shows a section taken along line V-V of FIG. 6.

In comparison to the nitride semiconductor device 1 according to the first preferred embodiment, the nitride semiconductor device 1A according to the second preferred embodiment differs in the arrangement of the gate portion 20 and the arrangement of the current path between the gate pad 23 and the gate electrodes 9.

As shown in FIG. 5, with the nitride semiconductor device 1A according to the second preferred embodiment, the gate portion 20 is constituted of the nitride semiconductor gate layer 6, grown epitaxially on the second nitride semiconductor layer 5, and the gate electrode 9, formed on the nitride semiconductor gate layer 6. The gate electrode 9 is formed to be in contact with the front surface of the nitride semiconductor gate layer 6.

As shown in FIG. 6, each source electrode 15 (S), each gate electrode 9 (G), and each drain electrode 16 (D) extend in a predetermined first direction (up-down direction of the paper surface of FIG. 6). In FIG. 6, portions of the source electrodes 15 (S) that cover the gate electrodes 9 (G) are omitted for the convenience of description. The source electrodes 15 (S), the gate electrodes 9 (G), and the drain electrodes 16 (D) are disposed periodically in the order of SGDGSGD in a second direction (right-left direction of the paper surface of FIG. 6) orthogonal to the first direction. Thereby, an element structure is arranged by each gate electrode 9 (G) being sandwiched by a source electrode 15 (S) and a drain electrode 16 (D). The region of the front surface of the semiconductor laminated structure includes the active area 41 that includes the element structure and the non-active areas 42 besides the active area 41.

Respective end portions of two gate electrodes 9 (G), disposed at both sides of each source electrode 15 (S), extend toward the non-active areas 42 and the end portions are joined by the joint portions 9a.

Referring to FIG. 6 and FIG. 7, in a non-active area 42 at one end portion sides of the gate electrodes 9, a first gate wiring metal 24, extending in the second direction, is disposed at a position above the joint portions 9a at the one end portion sides of the gate electrodes 9. The first gate wiring metal 24 is constituted, for example, of a TiN/AlCu/TiN laminated film in which a TiN film, an AlCu film, and a TiN film are laminated. The first gate wiring metal 24 may instead be constituted from a metal single film or laminated film other than a TiN/AlCu/TiN laminated film. The first gate wiring metal 24 has thickness of approximately 200 nm to 1000 nm.

A gate insulating film 25 is laminated on the first gate wiring metal 24. In the present preferred embodiment, the gate insulating film 25 is constituted of SiN. An area of a surface (upper surface or lower surface) of the gate insulating film 25 is greater than an area of a surface (upper surface or lower surface) of the nitride semiconductor gate layer 6. The gate insulating film 25 has a thickness of approximately 3 nm to 30 nm. Preferably, the film thickness of the gate insulating film 25 is not less than 10 nm. In the present preferred embodiment, the film thickness of the gate insulating film 25 is 30 nm. Besides SiN, the gate insulating film 25 may be constituted from $SiO_2$, SiON, $Al_2O_3$, AlN, AlON, HfO, HfN, HfON, HfSiON, AlON, etc.

A second gate wiring metal 26 is disposed on the gate insulating film 25. The second gate wiring metal 26 is constituted, for example, of a TiN/AlCu/TiN laminated film in which a TiN film, an AlCu film, and a TiN film are laminated. The second gate wiring metal 26 may instead be constituted from a metal single film or laminated film other than a TiN/AlCu/TiN laminated film. The second gate wiring metal 26 has thickness of approximately 200 nm to 1000 nm.

The joint portions 9a at the one end portion sides of the gate electrodes 9 and the first gate wiring metal 24 are electrically connected by gate vias 21 penetrating through the insulating film therebetween. The gate vias 21 are constituted, for example, of W (tungsten). The gate vias 21 may instead be constituted from a metal other than W (tungsten).

The gate pad 23 is disposed above one end portion of the second gate wiring metal 26. In FIG. 7, a section taken along line VIIa-VIIa of FIG. 6 is shown for the gate pad 23. The gate pad 23 has, at the central portion of its lower surface, the connection portion 23a, projecting downward and having the lower surface bonded to a front surface of the second gate wiring metal 26. The gate pad 23 is constituted, for example, of Al. The gate pad 23 may instead be constituted from a metal other than Al.

That is, the gate electrodes 9 are connected to the gate pad 23 via the gate vias 21, constituted of a metal, the first gate wiring metal 24, constituted of a metal, the gate insulating film 25, constituted of an insulator, and the second gate wiring metal 26, constituted of a metal.

That is, with the present preferred embodiment, a metal film (gate electrode 9) is formed on each nitride semiconductor gate layer 6 and the gate pad 23 is connected to the metal film (gate electrode 9) via the gate insulating film 25, having a lower surface (first surface) and an upper surface (second surface). The lower surface (first surface) of the gate insulating film 25 is electrically connected to the metal film (gate electrode 9) via metals (the first gate wiring metal 24 and a gate via 21). The upper surface (second surface) of the gate insulating film 25 is electrically connected to the gate pad 23 via a metal (the second gate wiring metal 26).

With the nitride semiconductor device 1A according to the second preferred embodiment described above, the gate leak current can be reduced in comparison to the first comparative example because the gate insulating film 25 is formed in the current path between the nitride semiconductor gate layer 6 and the gate pad 23. The nitride semiconductor gate layer 6 is thereby made less likely to degrade. With the present preferred embodiment, the gate leak current is not more than 1 nA/mm.

Although an interface trap is also formed in the nitride semiconductor device 1A according to the second preferred embodiment at an interface between the nitride semiconductor gate layer 6 and the gate electrode 9 (semiconductor/metal film interface), the interface trap is not a trap, into and from which electrons enter and exit, but acts to pin (fix) the barrier height. Therefore, with the nitride semiconductor device 1A according to the second preferred embodiment, it is possible to suppress the fluctuation of the threshold voltage in comparison to the second comparative example.

Figure 8:
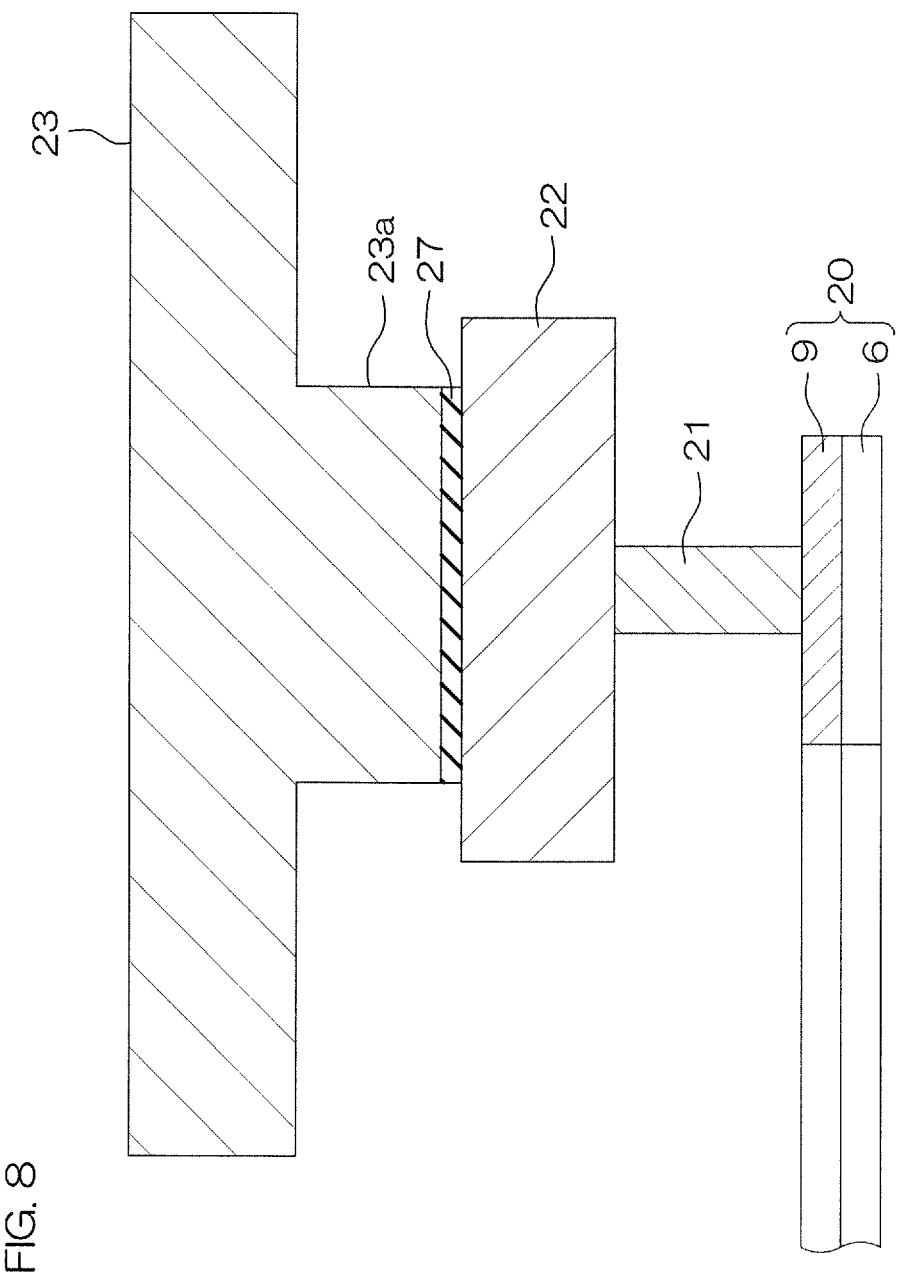
FIG. 8 is a diagram for describing a modification example of the second preferred embodiment and is a sectional view corresponding to FIG. 7.

As shown in FIG. 7, with the second preferred embodiment described above, the gate insulating film 25 is disposed between the first gate wiring metal 24 and the second gate wiring metal 26. However, with the second preferred embodiment, a gate wiring metal 22 of the same structure as the gate wiring metal 22 of the first preferred embodiment may be used in place of a laminated body of the first gate wiring metal 24, the gate insulating film 25, and the second gate wiring metal 26 and a gate insulating film 27 may be disposed between the gate wiring metal 22 and the connection portion 23a of the gate pad 23 as shown in FIG. 8.

With such an arrangement, a metal film (gate electrode 9) is formed on each nitride semiconductor gate layer 6 and the gate pad 23 is connected to the metal film (gate electrode 9) via the gate insulating film 27, having a lower surface (first surface) and an upper surface (second surface). The lower surface (first surface) of the gate insulating film 27 is electrically connected to the metal film (gate electrode 9) via the abovementioned metals (the first gate wiring metal 22 and a gate via 21). The upper surface (second surface) of the gate insulating film 27 is electrically connected directly to the gate pad 23. Even with such an arrangement, the same effects as the nitride semiconductor device 1A according to the second preferred embodiment are obtained.

Although the first and second preferred embodiments of the present invention have been described above, the present invention may be implemented in yet other modes. For example, although with each of the first and second preferred embodiments described above, an example where the first nitride semiconductor layer (electron transit layer) 4 is constituted of a GaN layer and the second nitride semiconductor layer (electron supply layer) 5 is constituted of an AlGaN layer was described, it suffices that the first nitride semiconductor layer 4 and the second nitride semiconductor layer 5 differ in bandgap (for example, in Al composition), and other combinations are also possible. As examples of the first nitride semiconductor layer 4/second nitride semiconductor layer 5 combination, GaN/AlN, AlGaN/AlN, etc., can be cited.

Also, although with each of the first and second preferred embodiments described above, silicon was taken up as an example of the material of the substrate 2, besides this, any substrate material, such as a sapphire substrate, a GaN substrate, etc., may be applied.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A nitride semiconductor device, comprising:
a first nitride semiconductor layer, constituting an electron transit layer;
a second nitride semiconductor layer, formed on the first nitride semiconductor layer and constituting an electron supply layer;
a nitride semiconductor gate layer, disposed on the second nitride semiconductor layer and containing an acceptor type impurity;
a gate metal film, formed on the nitride semiconductor gate layer;
a gate insulating film, formed on the gate metal film;
at least one gate electrode, formed on the gate insulating film;
a passivation film that covers a laminated structure including the nitride semiconductor gate layer, the gate metal film, the gate insulating film, and the at least one gate electrode;
a gate wiring metal formed on the passivation film;
a gate via that penetrates the passivation film and connects the at least one gate electrode and the gate wiring metal; and
a gate pad connected to the gate wiring metal;
wherein the gate insulating film is present only in a region between the gate metal film and the at least one gate electrode,
wherein the at least one gate electrode includes two gate electrodes being spaced apart with an interval, and each gate electrode is a ring-shaped gate electrode,
wherein the gate wiring metal includes a first connecting portion integrally connecting an end of one of the two gate electrodes, and a second connecting portion integrally connecting an end of the other of the two gate electrodes,
wherein a drain electrode is placed at the interval,
wherein source electrodes are enclosed by the ring-shaped gate electrodes respectively in a plan view, and
wherein a width of the at least one gate electrode extends in a predetermined first direction and a width of the gate wiring metal extends in a second direction orthogonal to the first direction in the plan view.

2. The nitride semiconductor device according to claim 1, wherein the gate insulating film is constituted from a single film, constituted of SiN or $SiO_2$, or a laminated film, containing SiN or $SiO_2$.

3. The nitride semiconductor device according to claim 1, wherein the nitride semiconductor gate layer has a film thickness of not more than 100 nm, and the gate insulating film has a film thickness of not less than 10 nm.

4. The nitride semiconductor device according to claim 1, further comprising: a third nitride semiconductor layer, disposed at a side of the first nitride semiconductor layer opposite a side of the second nitride semiconductor layer and constituting a buffer layer.

5. The nitride semiconductor device according to claim 4, wherein the first nitride semiconductor layer is constituted of a GaN layer, the second nitride semiconductor layer is constituted of an AlGaN layer, the nitride semiconductor gate layer is constituted of a p type GaN layer, and the third nitride semiconductor layer includes an AlGaN layer.

6. The nitride semiconductor device according to claim 1, wherein the first nitride semiconductor layer is constituted of a GaN layer, the second nitride semiconductor layer is constituted of an AlGaN layer, and the nitride semiconductor gate layer is constituted of a p type GaN layer.

* * * * *